(12) United States Patent
Kato

(10) Patent No.: US 9,081,274 B2
(45) Date of Patent: Jul. 14, 2015

(54) PATTERN FORMING METHOD

(71) Applicant: KABUSHIKI KAISHA TOSHIBA, Tokyo (JP)

(72) Inventor: Hirokazu Kato, Aichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/181,290

(22) Filed: Feb. 14, 2014

(65) Prior Publication Data

US 2014/0374379 A1    Dec. 25, 2014

(30) Foreign Application Priority Data

Jun. 21, 2013    (JP) .................................. 2013-130966

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *G03F 7/00* | (2006.01) |

(52) U.S. Cl.
CPC .................................. *G03F 7/0035* (2013.01)

(58) Field of Classification Search
CPC .................................................. G03F 7/0035
USPC ....................................................... 216/41, 46
See application file for complete search history.

(56) References Cited

U.S. PATENT DOCUMENTS

2012/0127454 A1    5/2012    Nakamura et al.
2014/0021166 A1*   1/2014    Seino et al. ..................... 216/40

FOREIGN PATENT DOCUMENTS

| JP | 2006-215052 A | 8/2006 |
| JP | 2011-078978   | 4/2011 |

OTHER PUBLICATIONS

Yuriko Seino, et al. "Contact hole shrink process using graphoepitaxial directed self-assembly lithography", Journal of Micro/Nanolithography, MEMS, and MOEMS. vol. 12(3), 033011, Aug. 12, 2013; doi: 10.1117/1.JMM.12.3.033011, 7 pages.

* cited by examiner

*Primary Examiner* — Roberts Culbert
(74) *Attorney, Agent, or Firm* — Patterson & Sheridan, LLP

(57) ABSTRACT

According to one embodiment, a pattern forming method includes, forming a first mask on a film to be processed, forming a guide that has a pattern including first openings and second openings, forming a second mask which covers the first openings and does not cover the second openings, etching the first mask using the second mask and the guide as a mask, removing the second mask, applying a self-assembling material into the first openings and the second openings, heating the self-assembling material to form a self-assembled pattern including a first polymer portion and a second polymer portion, etching the first polymer portion, etching the first mask using the second polymer portion and the guide as a mask, and processing the film to be processed using the first mask as a mask.

18 Claims, 8 Drawing Sheets

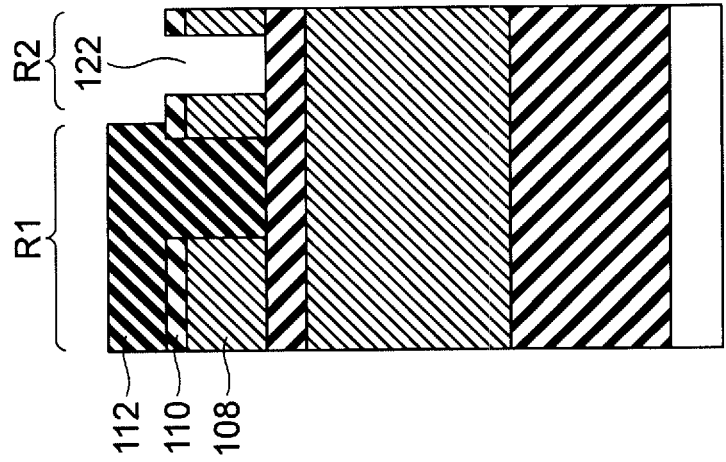
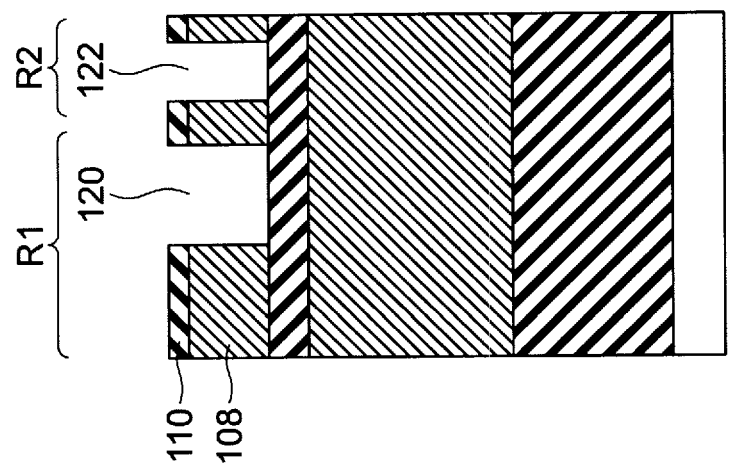
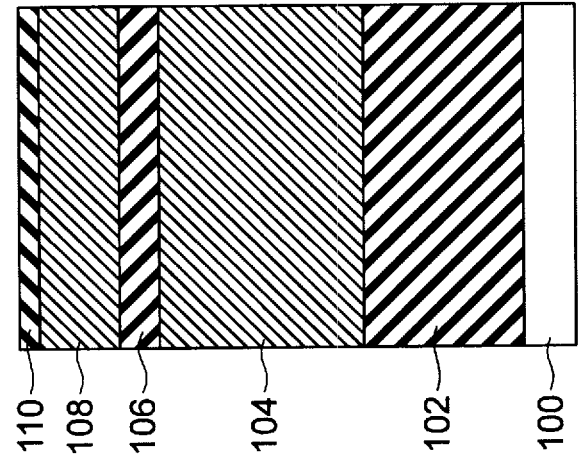

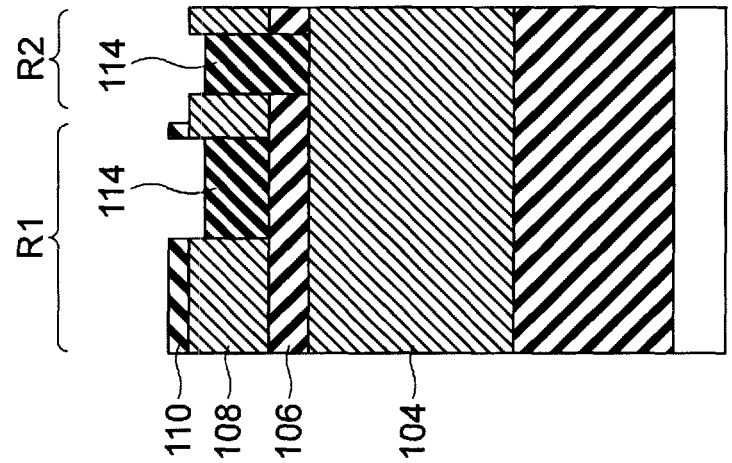
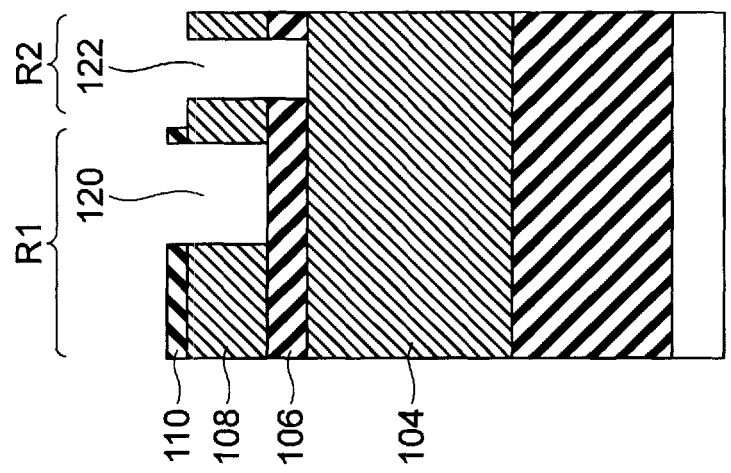
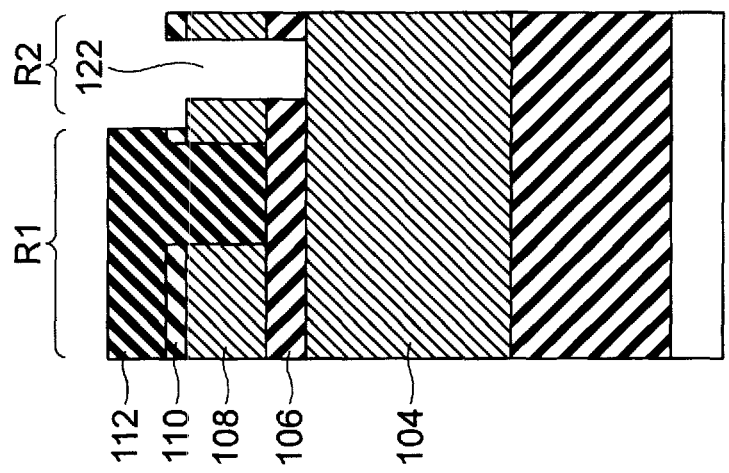

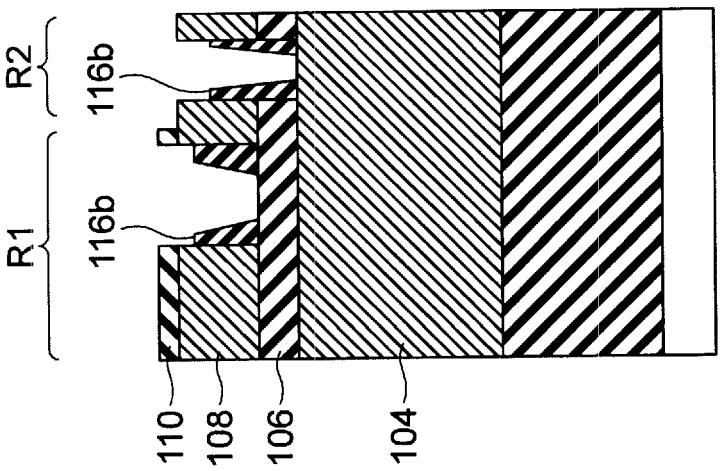
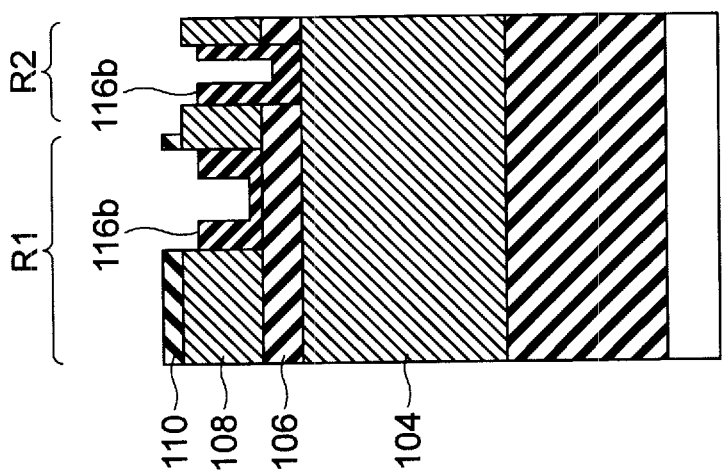
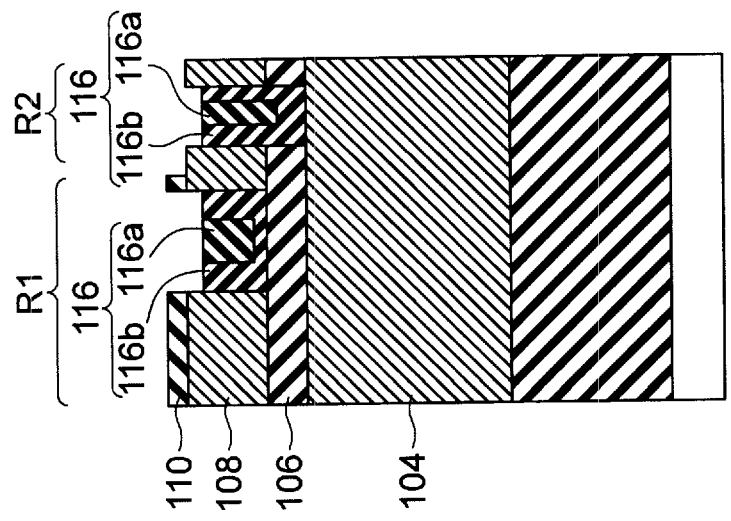

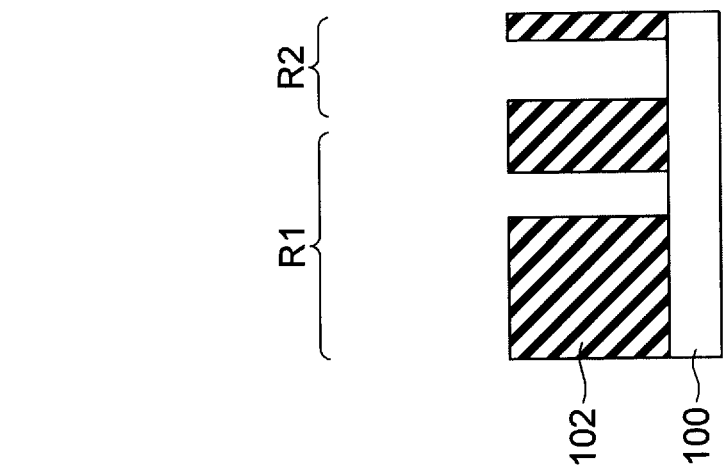
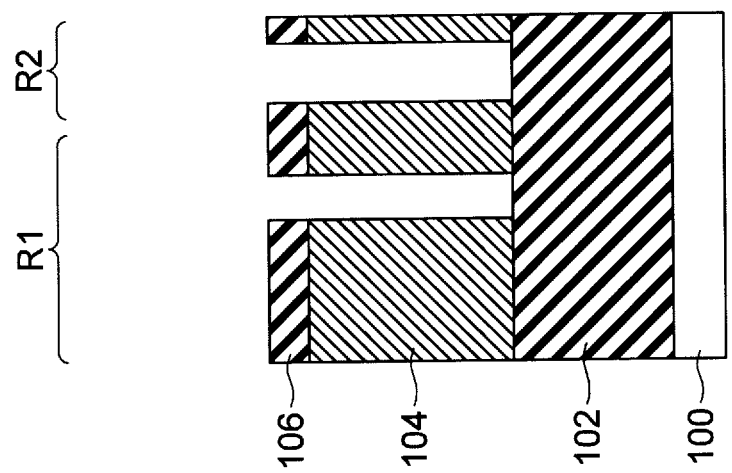
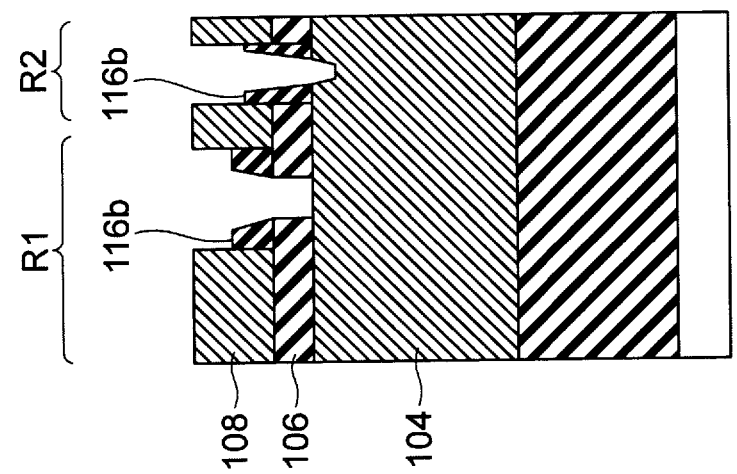

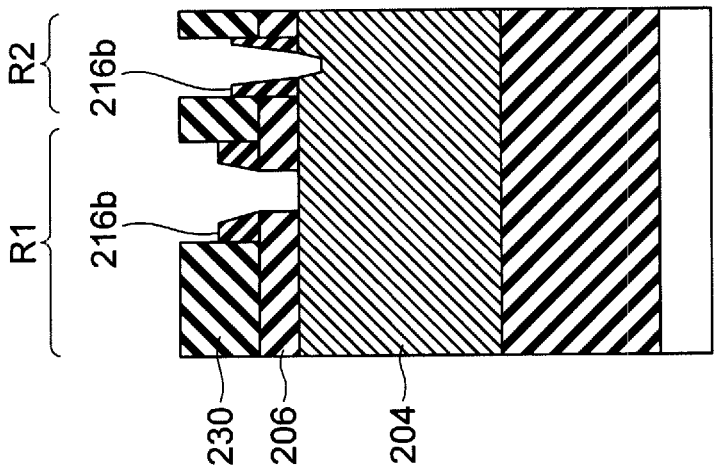
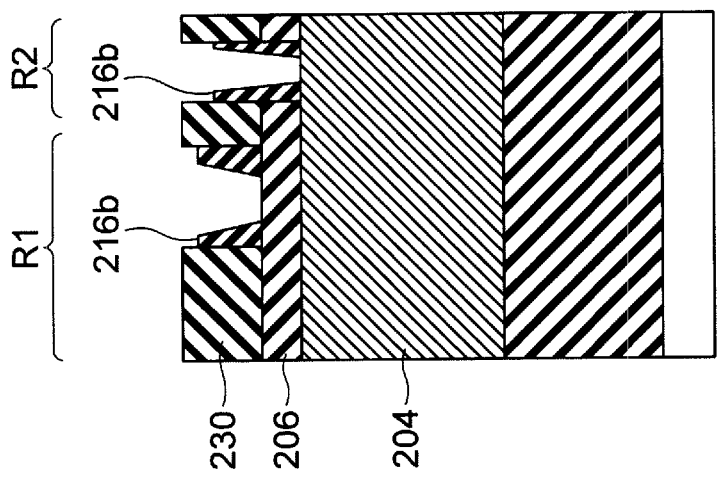
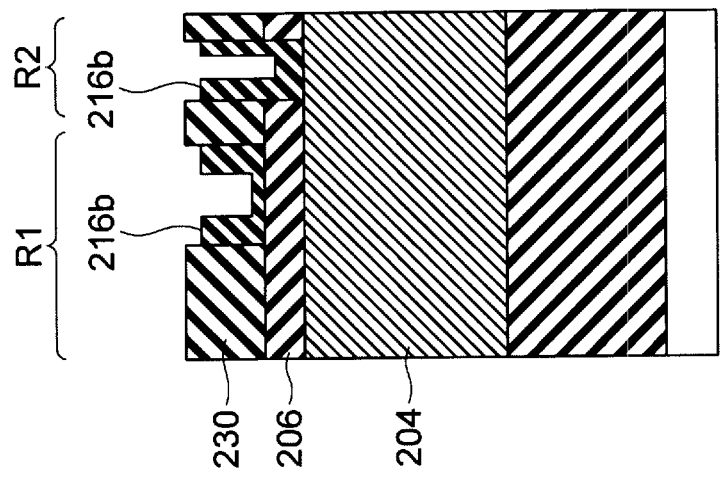

FIG. 8A
FIG. 8B
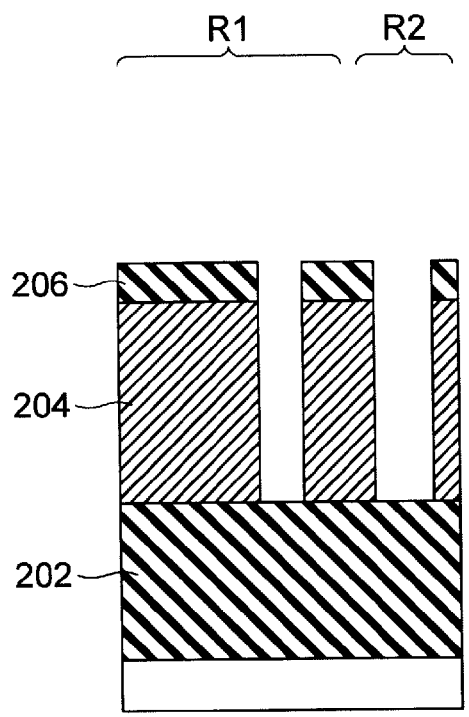
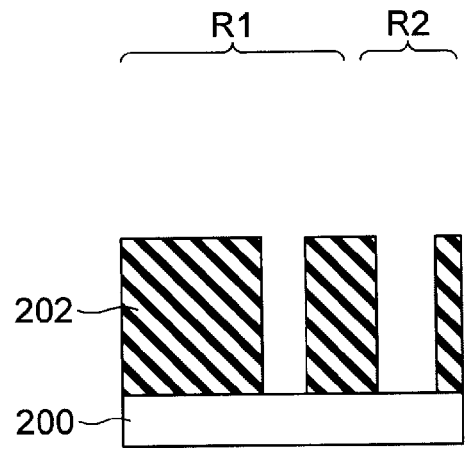

PATTERN FORMING METHOD

CROSS-REFERENCE TO RELATED APPLICATION

This application is based upon and claims the benefit of priority from Japanese Patent Application No. 2013-130966, filed Jun. 21, 2013, the entire contents of which are incorporated herein by reference.

FIELD

Embodiments described herein relate generally to a pattern forming method.

BACKGROUND

Known lithography technology used in a manufacturing process of a semiconductor element includes double patterning technology using ArF liquid immersion exposure, EUV lithography, nano-imprinting, and the like. The related lithography technologies suffer various drawbacks, such as an increase in manufacturing costs and a decrease in throughput, caused by refinement (reduction in the size and spacing) of the patterns.

Under such circumstances, the application of Directed Self-Assembly (DSA) materials to lithography technology has been considered. The self-assembly is achieved by energy stabilization to form a pattern having high dimensional accuracy. Particularly, the use of this technology includes the microphase separation of a block copolymer, which forms periodic structures having various shapes with dimensions of several nanometers (nm) to several hundred nm can be formed by a simple coating and annealing process. Dot patterns, hole patterns, pillar patterns, line patterns, or the like, of various sizes can be formed by changing the composition of the block copolymer.

DESCRIPTION OF THE DRAWINGS

FIG. 1A to FIG. 1C are cross-sectional views for explaining steps of a pattern forming method according to a first embodiment.

FIG. 2A to FIG. 2C are cross-sectional views for explaining steps of the pattern forming method according to the first embodiment.

FIG. 3A to FIG. 3C are cross-sectional views for explaining steps of the pattern forming method according to the first embodiment.

FIG. 4A to FIG. 4C are cross-sectional views for explaining steps of a pattern forming method according to the first embodiment.

FIG. 7A to FIG. 7C are cross-sectional views for explaining steps of the pattern forming method according to the second embodiment.

FIG. 8A and FIG. 8B are cross-sectional views for explaining steps of the pattern forming method according to the second embodiment.

DETAILED DESCRIPTION

Figure 5A:
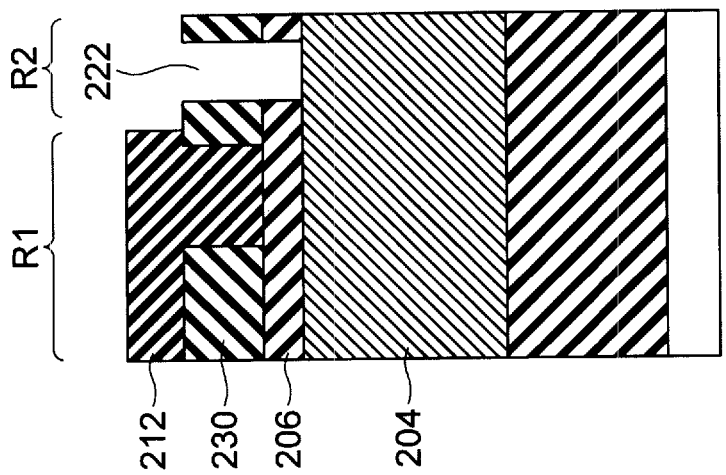
FIG. 5A to FIG. 5C are cross-sectional views for explaining steps of a pattern forming method according to a second embodiment.

In general, according to one embodiment, there is provided a pattern forming method which can form a pattern in a desired region, and can reduce manufacturing costs of semiconductor devices, or the like.

In general, according to one embodiment, a pattern forming method includes, forming on a film to be processed a hard mask, forming a guide that has an uneven pattern including first recessed portions and second recessed portions on the hard mask, forming a mask material which covers the first recessed portions and does not cover the second recessed portions, processing the hard mask using the mask material and the guide as a mask, removing the mask material, applying a self-assembling material to the first recessed portions and the second recessed portions by coating, forming a self-assembled pattern including a first polymer portion and a second polymer portion by phase separating the self-assembling material, removing the first polymer portion, processing the hard mask using the second polymer portion and the guide as a mask, and processing the film to be processed using the hard mask as a mask.

Hereinafter, embodiments are explained in conjunction with drawings.

First Embodiment

A pattern forming method of a first embodiment is explained in conjunction with cross-sectional views depicting steps of the method shown in FIG. 1A to FIG. 4C.

Firstly, as shown in FIG. 1A, a silicon oxide film 102, a carbon film 104, a silicon oxide film 106, an SOC (Spin-On-Carbon, coating-type carbon) film 108, and an SOG (Spin-On-Glass, coating-type glass) film 110 are sequentially formed on a substrate 100.

The substrate 100 is a silicon substrate, for example. The silicon oxide film 102 is formed by a CVD (chemical vapor deposition) method using TEOS (Tetra Ethyl Ortho Silicate) as a raw material, for example, and a film thickness of the silicon oxide film 102 is approximately 150 nanometers (nm).

The carbon film 104 is formed by a CVD method, for example, and a film thickness of the carbon film 104 is approximately 200 nm. The silicon oxide film 106 is formed by a CVD method, for example, and a film thickness of the silicon oxide film 106 is approximately 30 nm.

A film thickness of the SOC film 108 is approximately 100 nm, and a film thickness of the SOG film 110 is approximately 35 nm, for example.

In this embodiment, as described in more detail below, the silicon oxide film 106 is used as a hard mask for etching the carbon film 104, and the etched carbon film 104 is then used as a mask for etching the silicon oxide film 102.

Next, as shown in FIG. 1B, the SOG film 110 and the SOC film 108 are processed using known lithography techniques, thus forming hole patterns (first recessed portions) 120 in a cell region R1 and forming hole patterns (second recessed portions) 122 in a peripheral circuit region R2.

The cell region R1 is a region where patterns of a single type (having the same size and shape) are repeatedly formed. The pattern features may be larger than the features ultimately formed in an underlying layer or material in the cell region R1. One example of a cell region R1 is a memory cell array.

The peripheral circuit region R2 is a region where patterns of various types (having different sizes or shapes) are formed. In the peripheral circuit region R2, patterns having a size and a shape different from the size and the shape of the patterns in the cell region R1 may be formed, or patterns having the size or shape equal to the size or shape of the patterns in the cell region R1 may be formed. An example of a region R2 is the control and logic region peripheral to (adjacent to) a memory cell array. The hole patterns 122 are patterns having shapes corresponding to the patterns formed in the peripheral circuit region R2. In some embodiments the pattern features may be equal in size to the pattern features to be formed in the peripheral circuit region R2. In other embodiments, the pattern features may be larger than the pattern features to be formed in the peripheral circuit region R2 (such as when a feature is formed to include a tapered sidewall as opposed to a straight vertical sidewall).

The SOG film 110 and SOC film 108, in which the hole patterns 120 and 122 are formed, function as physical guide layers when a block copolymer is etched (after a microphase separation of the block copolymer (formed in a subsequent step)). In other words, a lower layer film and an intermediate film of a three-layer resist structure are processed into a physical guide having an uneven pattern consisting of openings formed in the physical guide layer.

Next, as shown in FIG. 1C, a resist (mask material) 112 is coated over the SOG film and cell regions R1 and R2. Thereafter, it is lithographically patterned to expose region R2 but leave covered the cell region R1. Thus, the hole patterns 120 (first openings) are covered with the resist 112, while the hole patterns 122 (second openings) are not covered with the resist 112. High resolution lithography is not required in this step so the exposure of the resist to open the peripheral circuit region R2 can be carried out using i-line lithography, for example.

Next, as shown in FIG. 2A, using the physical guide (the exposed SOG film 110 and the SOC film 108) and the resist 112 as a mask, the silicon oxide film 106 in the hole patterns 122 of the peripheral circuit region R2 is processed by dry etching. Due to such etching, the silicon oxide film 106 in regions where the hole patterns 122 are formed is removed so that a surface of the underlying spin on carbon film 104 is exposed.

Next, as shown in FIG. 2B, the resist 112 is removed using a known method such as dry etching and/or wet processing.

Then, as shown in FIG. 2C, a block copolymer 114 is applied to the hole patterns 120 and the hole patterns 122 by a coating process. For example, polyethylene glycol monomethylether acetate (PGMEA) solution containing a block copolymer (PS-b-PMMA) of polystyrene (PS) and polymethyl methacrylate (PMMA) is applied to the hole patterns 120 and the hole patterns 122 by spin-coating. Due to such coating, the block copolymers 114 fill the hole patterns 120 and 122 respectively.

The block copolymer 114 used in this embodiment has the composition which conforms to the design of the cell region R1.

Next, as shown in FIG. 3A, by thermal annealing (heating), the block copolymer 114 is microphase separated so that a self-assembled pattern 116, which includes a first polymer portion 116a containing a first segment, and a second polymer portion 116b containing a second segment is formed. For example, the first polymer portion 116a containing PMMA (first segment) is formed at a center portion, and the second polymer portion 116b containing PS (second segment) is formed on the periphery of and on a lower portion of (i.e., below) the first polymer portion 116a. For example, the center portion of the hole pattern 120 includes a diameter of 70 nm, and the cylinder-shaped first polymer portion 116a includes a diameter of 25 nm.

The self-assembled pattern 116 is formed on the silicon oxide film 106 in the cell region R1, and the self-assembled pattern 116 is formed on the carbon film 104 in the peripheral circuit region R2.

As shown in FIG. 3A, also in the peripheral circuit region R2, in the same manner as the cell region R1, the first polymer portion 116a is formed at a center portion, and the second polymer portion 116b is formed on the periphery of and on a lower portion of the first polymer portion 116a. However, the block copolymer 114 has a composition which conforms only to the design (size and spacing of the pattern features or hole patterns 120) of the cell region R1 and hence, there may be a case where the phase separation shown in FIG. 3A does not occur in the hole pattern 122. For example, in the hole pattern 122, a pattern may be formed in a state where the first polymer portion 116a and the second polymer portion 116b remain intermixed, or where a complicated (or incomplete) phase separation occurs Next, as shown in FIG. 3B, wet developing is performed so as to selectively remove the first polymer portions 116a while leaving the second polymer portion 116b.

Then, as shown in FIG. 3C, dry etching is performed so as to remove a part of the second polymer portion 116b. Due to such etching, in the cell region R1, a surface of the silicon oxide film 106, corresponding to the lower portion of the first polymer portion 116a, is exposed. On the other hand, in the peripheral circuit region R2, a surface of the carbon film 104, corresponding to the lower portion of the first polymer portion 116a, is exposed.

Next, as shown in FIG. 4A, using the physical guide (the SOG film 110 and the SOC film 108) and the first polymer portion 116b as masks, the silicon oxide film 106 is processed by dry etching. Portions of the silicon oxide film 106, the SOG film 110 is also removed during the etching. In the cell region R1, a pattern shape of the first polymer portion 116a is transferred to the silicon oxide film 106. With respect to the hole pattern 122 in the peripheral circuit region R2, the silicon oxide film 106 is already removed in the step shown in FIG. 2A.

Then, as shown in FIG. 4B, using the silicon oxide film 106 as a mask, the carbon film 104 is processed by dry etching. For example, by using oxygen gas chemistry, the carbon film 104, the SOC film 108 and the second polymer portion 116b are rapidly removed during the etching whereas the silicon oxide film remains mostly undamaged. In the cell region R1, a fine pattern shape, corresponding to the first polymer portion 116a, is transferred to the carbon film 104. In the peripheral circuit region R2, a pattern shape, corresponding to the hole pattern 122, is transferred to the carbon film 104.

Next, as shown in FIG. 4C, using the carbon film 104 as a mask, the silicon oxide film 102 is processed by dry etching. The silicon oxide film 102 and the silicon oxide film 106 is also removed during the etching. In the cell region R1, a fine pattern shape, corresponding to the first polymer portion 116a (FIG. 3A) is transferred to the silicon oxide film 102. In the peripheral circuit region R2, a pattern shape corresponding to the hole pattern 122 is transferred to the silicon oxide film 102, but the self-assembled pattern 116 (FIG. 3A) is not transferred to the silicon oxide film 102. Thereafter, the carbon film 104 is removed by ashing.

In this manner, according to this embodiment, the self-assembled pattern 116 (FIG. 3A) can be transferred only in the cell region R1. Further, high resolution is not required in exposure at the time of forming the resist 112 and hence, manufacturing costs can be reduced as compared to an LELE (Litho-Etch-Litho-Etch) scheme by which the cell region R1 and the peripheral circuit region R2 are patterned separately. Accordingly, the pattern forming method according to this embodiment can form a pattern in a desired region using self-assembly materials, and can also reduce manufacturing costs. Because the underlying silicon oxide layer 106 in the peripheral circuit region R2 is etched away prior to the application of the self assembly material into the regions, the size of the hole patterns (widths) are directly transferred into the underlying hardmask (spin on carbon film 104), whereas the size of the opening in the silicon oxide layer 106 is defined by the second portion 116b of the self assembly material in the first region R1 hole openings 120, and hence a width smaller than the width of the features defined by the hole openings 120 is etched into the spin on carbon film 104). For example, the material in the peripheral circuit region R2 is an organic material (similar to the film 104 and the film 108) it is easily etched away and therefore does not affect the final dimension in the film 104.

In the first embodiment, an amorphous silicon film may be formed in place of the silicon oxide film 106.

In the first embodiment, the first polymer portion 116a is selectively removed by wet development (see FIG. 3B) and, thereafter, the part of the second polymer portion 116b is removed by dry etching (see FIG. 3C). However, the first polymer portion 116a and the portion of the second polymer portion 116b may be collectively removed by dry etching.

Second Embodiment

A pattern forming method according to a second embodiment is explained in conjunction with cross-sectional views depicting steps of the method shown in FIG. 5A to FIG. 8B.

Firstly, as shown in FIG. 5A, on a substrate 200, a silicon oxide film 202, a carbon film 204, and a silicon oxide film 206 are sequentially formed.

The substrate 200 is a silicon substrate, for example. The silicon oxide film 202 is formed by a CVD (chemical vapor deposition) method using TEOS (Tetra Ethyl Ortho Silicate) as a raw material, for example, and a film thickness of the silicon oxide film 202 is approximately 150 nm.

The carbon film 204 is formed by a CVD method, for example, and a film thickness of the carbon film 204 is approximately 200 nm. The silicon oxide film 206 is formed by a CVD method, for example, and a film thickness of the silicon oxide film 206 is approximately 30 nm.

In this embodiment, as described in more detail below, the silicon oxide film 206 is used as a hard mask for etching the carbon film 204, while the etched carbon film 204 is then used as a mask for etching the silicon oxide film 202.

Subsequently, on the silicon oxide film 202, resist pattern 230 having a film thickness of approximately 100 nm is formed using known lithography. In the resist pattern 230, hole patterns (first recessed portions) 220 are formed in the cell region R1, and hole patterns (second recessed portions) 222 are formed in the peripheral circuit region R2.

For example, as described with respect to the first embodiment herein, the cell region R1 is a region where patterns of a single type (having the same size and shape) are repeatedly formed, and they have a size different than that ultimately to be formed in the cell region R1 of a device. For example, the peripheral circuit region R2 is a region where patterns of various types (having different sizes or shapes) are formed. In the peripheral circuit region R2, patterns having a size and a shape different from the size and the shape of the patterns in the cell region R1 may be formed, or patterns having the size or shape equal to the size or shape of the patterns in the cell region R1 may be formed. The hole patterns 222 are patterns having shapes corresponding to the patterns formed in the peripheral circuit region R2. In some embodiments, shapes of the pattern features may be equal to the shapes of the patterns formed in the peripheral circuit region R2. In other embodiments, shapes of the pattern features may be larger than the pattern features to be formed in the peripheral circuit region R2 (such as when a feature is formed to include a tapered sidewall as opposed to a sidewall having straight walls).

The patterned resist 230 functions as a physical guide layer when a block copolymer is later etched (after a microphase separation of the block copolymer (formed in a subsequent step)). To enable use of the patterned resist 230 as a hardmask, the resist 230 contains a thermal cross-linking agent which is accelerated by heat treatment to make the patterned resist 230 insoluble when an organic solvent is applied to the patterned resist 230.

Figure 5B:
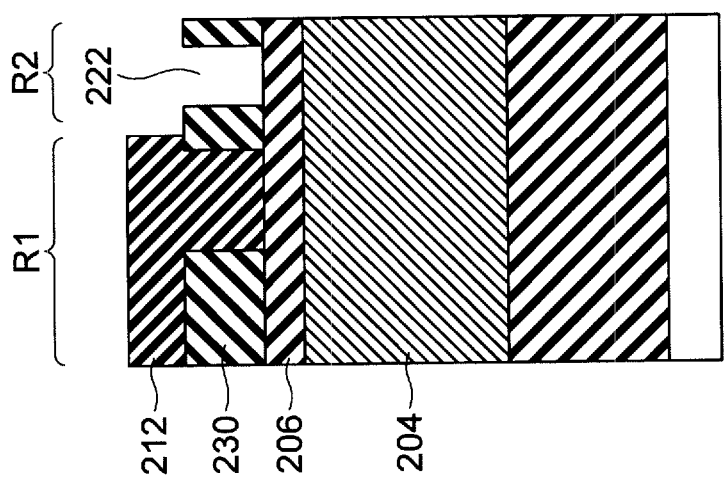

Next, as shown in FIG. 5B, a resist 212, which covers the cell region R1, and leaves exposed (does not cover) the peripheral circuit region R2, is formed by lithography. The hole pattern 220 is covered with the resist 212, while the hole pattern 222 is not covered with the resist 212. High resolution lithography is not required in this step so the exposure can be carried out using i-line lithography, for example. Since the resist pattern 230 has been treated to be insoluble in advance of the exposure, the pattern formed in resist 212 is not formed in the resist 230.

Figure 5C:
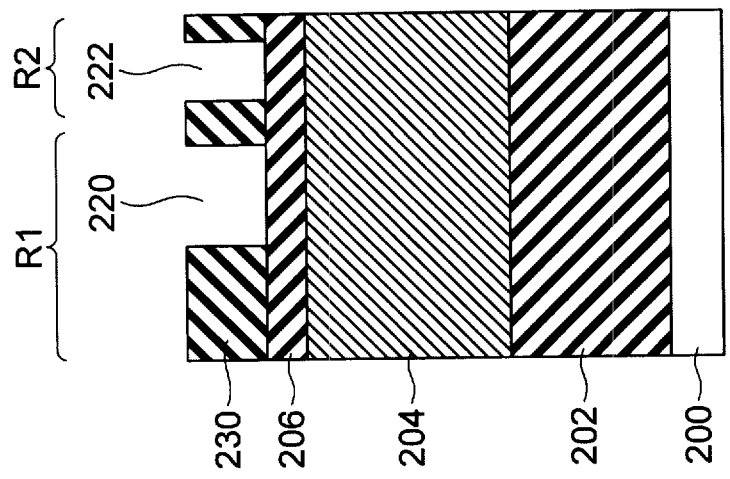

Next, as shown in FIG. 5C, using the physical guide (resist pattern 230) and the resist 212 as a mask, the silicon oxide film 206 in the peripheral circuit region R2 is processed by dry etching. Due to such etching, the silicon oxide film 206 in regions where the hole patterns 222 are formed is removed so that a surface of the carbon film 204 is exposed.

Figure 6A:
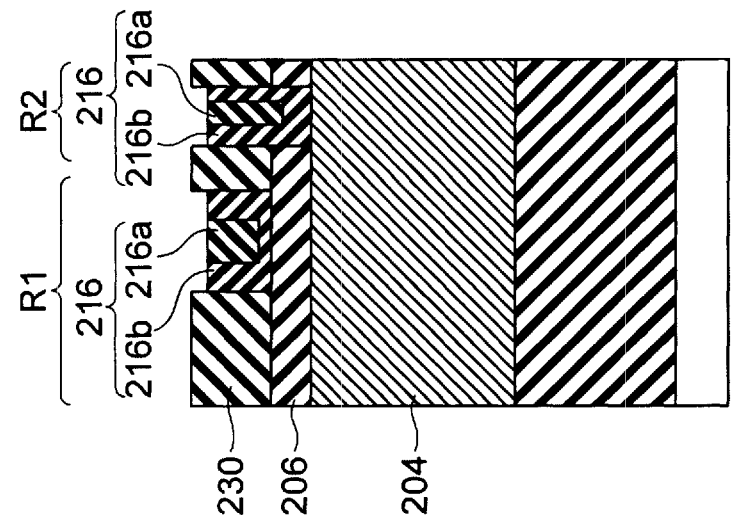
FIG. 6A to FIG. 6C are cross-sectional views for explaining steps of the pattern forming method according to the second embodiment.

Next, as shown in FIG. 6A, the resist 212 is removed using a known method such as ashing and/or wet processes.

Figure 6B:
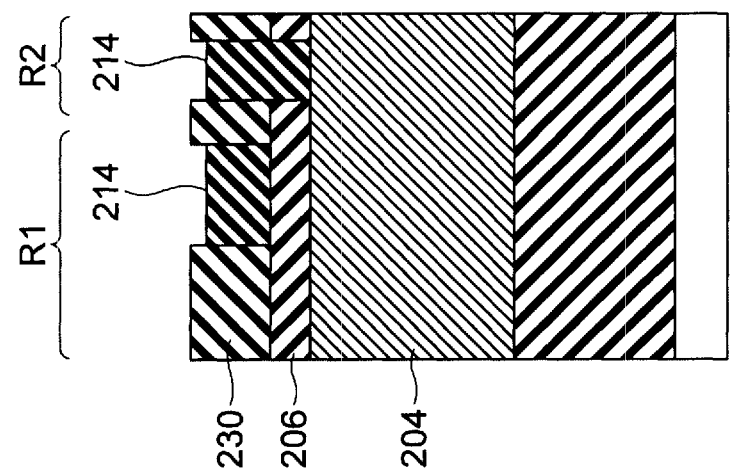

Then, as shown in FIG. 6B, a block copolymer 214 is applied to the hole patterns 220, 222 by a coating process. For example, polyethylene glycol monomethylether acetate (PG-MEA) solution containing a block copolymer (PS-b-PMMA) of polystyrene (PS) and polymethyl methacrylate (PMMA) is applied to the hole pattern 220 and the hole pattern 222 by spin-coating. Due to such coating, the block copolymers 214 are fill the hole patterns 220 and 222, respectively.

The block copolymer 214 used in this embodiment has the composition which conforms to the design of the cell region R1.

Figure 6C:
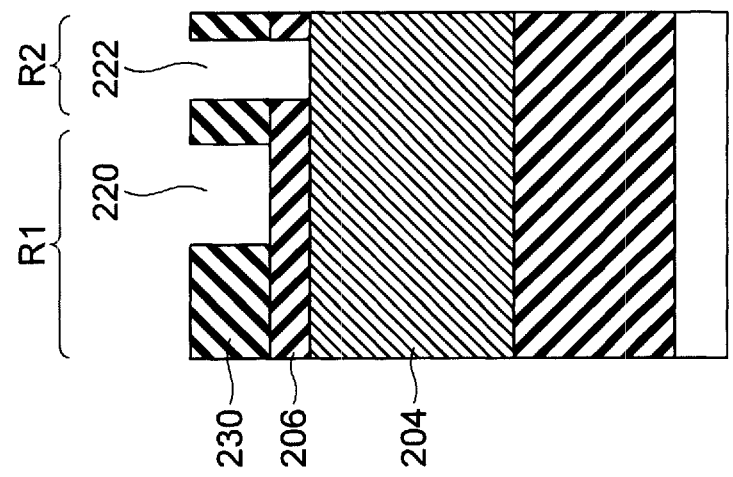

Next, as shown in FIG. 6C, by thermal annealing (heating), the block copolymer 214 is microphase separated so that a self-assembled pattern 216, which includes a first polymer portion 216a containing a first segment, and a second polymer portion 216b containing a second segment is formed. For example, the first polymer portion 216a containing PMMA (first segment) is formed at a center portion, and the second polymer portion 216b containing PS (second segment) is formed on the periphery of and on a lower portion of the first polymer portion 216a. For example, the center portion of the hole pattern 220 includes a diameter of 70 nm and the cylinder-shaped first polymer portion 216a includes a diameter of 25 nm.

The self-assembled pattern 216 is formed on the silicon oxide film 206 in the cell region R1, and the self-assembled pattern 216 is formed on the carbon film 204 in the peripheral circuit region R2.

As shown in FIG. 6C, also in the peripheral circuit region R2, in the same manner as the cell region R1, the first polymer portion 216a is formed at a center portion, and the second polymer portion 216b is formed on the periphery of and on a lower portion of the first polymer portion 216a. However, the block copolymer 214 has a composition which conforms to the design of the cell region R1 and hence, there may be a case where the phase separation shown in FIG. 6C does not occur in the hole pattern 222. For example, in the hole pattern 222, a pattern may be formed in a state where the first polymer portion 216a and the second polymer portion 216b are intermixed, i.e., unseparated, or a complicated phase separation may occur.

Next, as shown in FIG. 7A, wet developing is performed so as to selectively remove the first polymer portions 216a while leaving the second polymer portion 216b.

Then, as shown in FIG. 7B, dry etching is performed so as to remove a part of the second polymer portion 216b. Due to this etching, in the cell region R1, a surface of the silicon oxide film 206, corresponding to the lower portion of the first polymer portion 216a is exposed. On the other hand, in the peripheral circuit region R2, a surface of the carbon film 204, corresponding to the lower portion of the first polymer portion 216a is exposed.

Next, as shown in FIG. 7C, using the physical guide (resist pattern 230) and the first polymer portion 216b as masks, the silicon oxide film 206 is processed by dry etching. In the cell region R1, a pattern shape of the first polymer portion 216a is transferred to the silicon oxide film 206. With respect to the hole pattern 222 in the peripheral circuit region R2, the silicon oxide film 206 is already removed in the step shown in FIG. 5C.

Then, as shown in FIG. 8A, using the silicon oxide film 206 as a mask, the carbon film 204 is processed by dry etching. Along with the etching of the carbon film 204, the resist pattern 230 and the second polymer portion 216b are removed. In the cell region R1, a fine pattern shape corresponding to the first polymer portion 216a is transferred to the carbon film 204. In the peripheral circuit region R2, a pattern shape corresponding to the hole pattern 222 is transferred to the carbon film 204.

Next, as shown in FIG. 8B, using the carbon film 204 as a mask, the silicon oxide film 202 is processed by dry etching. Along with the etching of the silicon oxide film 202, the silicon oxide film 206 is removed. In the cell region R1, a fine pattern shape corresponding to the first polymer portion 216a (FIG. 6C) is transferred to the silicon oxide film 202. In the peripheral circuit region R2, a pattern shape corresponding to the hole pattern 222 (FIG. 6A) is transferred to the silicon oxide film 202, but the self-assembled pattern 216 (FIG. 6C) is not transferred to the silicon oxide film 202. Thereafter, the carbon film 204 is removed by ashing.

In this manner, according to this embodiment, the self-assembled pattern 216 can be transferred only in the cell region R1. Further, high resolution is not required in exposure at the time of forming the resist 212 and hence, manufacturing costs can be reduced compared to a LELE scheme. Accordingly, the pattern forming method of this embodiment can form a pattern in a desired region using self-assembly technology, and can also reduce manufacturing costs.

In the second embodiment, treatment to make the resist pattern 230 insoluble is applied by heat treatment to the resist pattern 230 containing a thermal cross-linking agent. However, other treatment to make the resist pattern 230 insoluble may be performed such that a thin film is formed on a surface of the resist pattern 230, such as by irradiating with an electron beam.

In the second embodiment, the first polymer portion 216a is selectively removed by wet developing (see FIG. 7A) and, thereafter, a part of the second polymer portion 216b is removed by dry etching (see FIG. 7B). However, the first polymer portion 216a and the portion of the second polymer portion 216b may be collectively removed by dry etching.

In the first and second embodiments, a material for forming the block copolymers 114, 214 is not limited to a PS-b-poly t-butoxy methacrylate-based material, and various other materials can be used. Further, a shape of the physical guide may be an elliptical shape or a rectangular shape. By adjusting a molecular weight of each segment of the block copolymers 114, 214, the shape of the physical guide may be set to conform to different guide pattern sizes, or the physical guide may be formed into a lamellae pattern or a sphere pattern in place of a cylinder pattern.

In the first and second embodiments, in the drawings, the peripheral circuit region R2 is arranged adjacent to the cell region R1. However, the cell region R1 and the peripheral circuit region R2 may be arranged at an arbitrary position on a chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming a first mask on a film to be processed;
    forming a guide having a first pattern including first openings and second openings on the first mask;
    forming a second mask which covers the first openings and not the second openings;
    etching the first mask using the second mask and the guide as a mask;
    removing the second mask;
    introducing a material having a first segment and a second segment into the first openings and the second openings;
    heating the material to form a second pattern including the first segment and the second segment through phase separation;
    removing the first segment;
    etching the first mask using the second segment and the guide as a mask; and
    etching the film to be processed using the first mask as a mask.

2. The pattern forming method according to claim 1, wherein the guide includes a cell region where a plurality of first recessed portions are formed and a peripheral circuit region where a plurality of second recessed portions are formed.

3. The pattern forming method according to claim 2, wherein the plurality of first recessed portions have a substantially similar shape.

4. The pattern forming method according to claim 3, wherein the plurality of second recessed portions includes a plurality of patterns which have a different shape.

5. The pattern forming method according to claim 1, wherein the guide includes a lower layer film and an intermediate film of a three-layer mask material structure.

6. The pattern forming method according to claim 5, wherein the guide includes a cell region where a plurality of first recessed portions are formed and a peripheral circuit region where a plurality of second recessed portions are formed.

7. The pattern forming method according to claim 6, wherein the plurality of first recessed portions have a substantially similar shape.

8. The pattern forming method according to claim 7, wherein the plurality of second recessed portions includes a plurality of patterns which have a different shape.

9. The pattern forming method according to claim 5, wherein the guide includes a cell region where a plurality of first recessed portions are formed and a peripheral circuit region where a plurality of second recessed portions are formed.

10. The pattern forming method according to claim 9, wherein the plurality of first recessed portions have a substantially similar shape.

11. The pattern forming method according to claim 10, wherein the plurality of second recessed portions includes a plurality of patterns which have a different shape.

12. The pattern forming method according to claim 1, wherein the guide is made of a resist material that is treated so as to be insoluble in an organic solvent.

13. A pattern forming method comprising:
forming a hard mask on a film to be processed;
forming a guide having a pattern including first recessed portions and second recessed portions;
forming a mask material which covers the first recessed portions and not the second recessed portions;
processing the hard mask using the mask material and the guide as a mask;
removing the mask material;
introducing a self-assembly material into the first recessed portions and the second recessed portions;
forming a self-assembled pattern including a first polymer portion and a second polymer portion by heating the self-assembly material;
removing the first polymer portion;
etching the hard mask using the second polymer portion and the guide as a mask; and
etching the film to be processed using the hard mask as a mask.

14. The pattern forming method according to claim 13, wherein the guide includes a cell region where a plurality of first recessed portions are formed and a peripheral circuit region where a plurality of second recessed portions are formed.

15. The pattern forming method according to claim 14, wherein the plurality of first recessed portions have a substantially similar shape and the plurality of second recessed portions includes a plurality of patterns which have a different shape.

16. The pattern forming method according to claim 13, wherein the guide includes a lower layer film and an intermediate film of a three-layer mask material structure.

17. The pattern forming method according to claim 13, wherein the guide is made of a resist material that is treated so as to be insoluble in an organic solvent.

18. The pattern forming method according to claim 13, wherein the guide includes a cell region where a plurality of first recessed portions are formed and a peripheral circuit region where a plurality of second recessed portions are formed, and wherein the plurality of first recessed portions have a substantially similar shape, and the plurality of second recessed portions includes a plurality of patterns which have a different shape.

* * * * *